United States Patent
Rajagopal

(10) Patent No.: US 8,198,918 B1
(45) Date of Patent: Jun. 12, 2012

(54) CAPACITOR CELL SUPPORTING CIRCUIT OPERATION AT HIGHER-VOLTAGES WHILE EMPLOYING CAPACITORS DESIGNED FOR LOWER VOLTAGES

(75) Inventor: Karthik Rajagopal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 12/979,387

(22) Filed: Dec. 28, 2010

(51) Int. Cl.
*H03K 19/094* (2006.01)
*H03K 19/082* (2006.01)

(52) U.S. Cl. .......................... 326/88; 326/92

(58) Field of Classification Search .............. 326/82–92
See application file for complete search history.

(56) References Cited

U.S. PATENT DOCUMENTS

| | | | | |
|---|---|---|---|---|
| 3,735,195 | A * | 5/1973 | Jenkins et al. | 315/363 |
| 7,020,039 | B2 * | 3/2006 | Tran et al. | 365/222 |
| 7,528,667 | B1 * | 5/2009 | Tan et al. | 331/36 C |
| RE41,926 | E * | 11/2010 | Lee | 327/170 |
| 2005/0099836 | A1 * | 5/2005 | Tran et al. | 365/63 |
| 2007/0085598 | A1 * | 4/2007 | Saglam et al. | 327/536 |
| 2010/0308932 | A1 * | 12/2010 | Rangarajan et al. | 331/167 |

* cited by examiner

*Primary Examiner* — Shawki S Ismail
*Assistant Examiner* — Thienvu Tran
(74) *Attorney, Agent, or Firm* — John R. Pessetto; W. James Brady; Frederick J. Telecky, Jr.

(57) ABSTRACT

An integrated circuit (IC) includes a functional circuit and a capacitor cell. The functional circuit may operate with one of two power supply voltages. The capacitor cell is used to provide power supply decoupling for the functional circuit, and includes multiple capacitors, each designed to withstand a maximum voltage equal to the lower of the two power supply voltages. When the functional circuit is to operate with the higher of the two power supply voltages, the capacitors in the capacitor cell are coupled in a series arrangement between power supply and ground terminals of the IC. When the functional circuit is to operate with the lower of the two power supply voltages, the capacitors in the capacitor cell are coupled in a parallel arrangement between the power supply and ground terminals. In an embodiment, the functional circuit is an input-output (I/O) circuit powered by 1.8V or 3.3V power supplies.

9 Claims, 2 Drawing Sheets

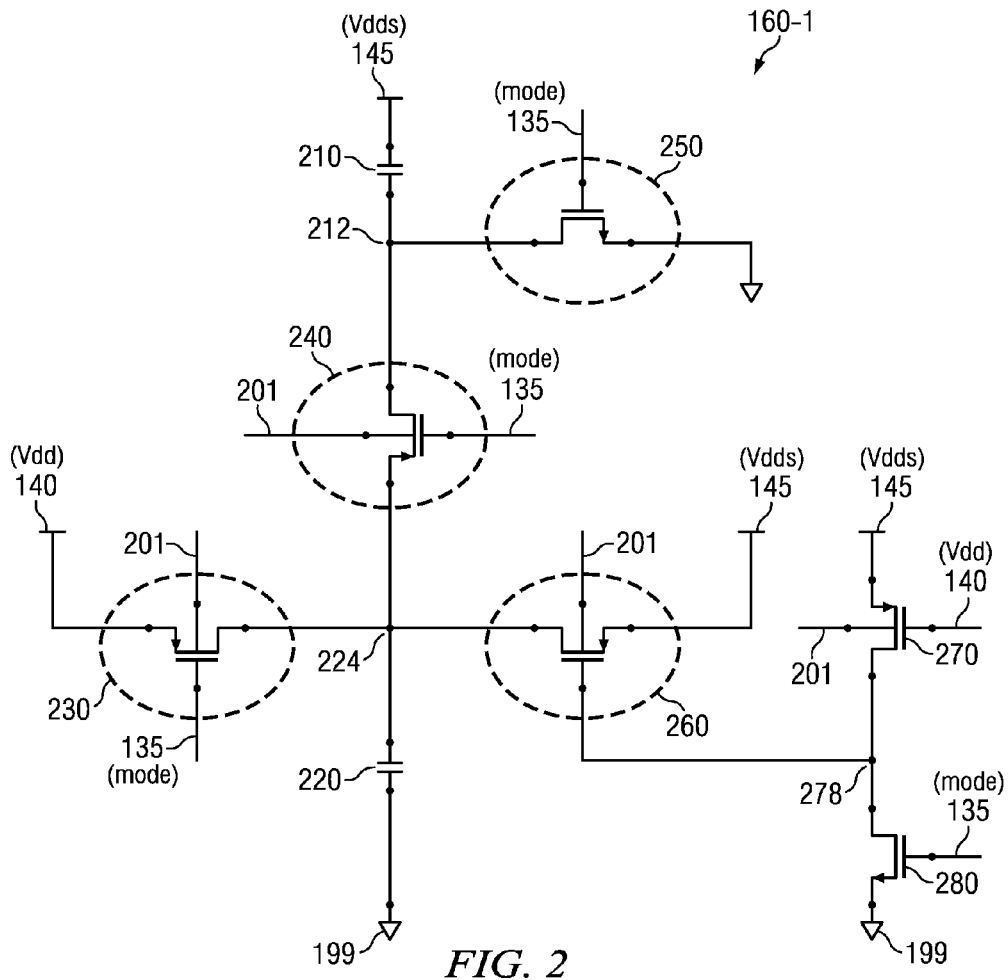
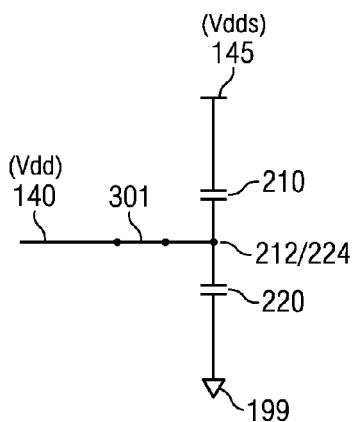
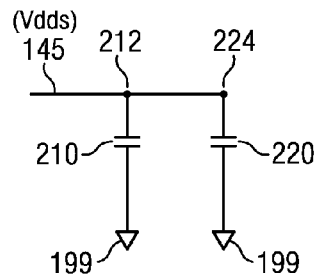
FIG. 2
FIG. 3A    FIG. 3B

CAPACITOR CELL SUPPORTING CIRCUIT OPERATION AT HIGHER-VOLTAGES WHILE EMPLOYING CAPACITORS DESIGNED FOR LOWER VOLTAGES

BACKGROUND

1. Technical Field

Embodiments of the present disclosure relate generally to de-coupling capacitors, and more specifically to a capacitor cell supporting circuit operation at higher-voltages while employing capacitors designed for lower voltages.

2. Related Art

Both integrated circuit capacitors and conventional parallel plate capacitors have voltage rating specifying the maximum voltage that can be applied across their terminals without causing damage to the capacitor structure. Integrated circuit capacitors are often implemented using a metal-oxide-semiconductor (MOS) transistor structure, fabricated using corresponding fabrication processes. Typically, the gate-oxide thickness is determined by the fabrication process, and may be designed to target a specific operational environment, such as for example, operation with low-voltage power supplies. One example of a MOS capacitor fabrication process is a 1.8V fabrication process, in which the gate oxide of the MOS capacitor is designed to withstand a maximum voltage across it of 1.8V.

Capacitors often need to be employed in circuits that operate from power supply voltages that are greater than the maximum safe voltage that can be applied across the capacitors. An example is an input-output (I/O) circuit that can selectively be chosen to operate from a 1.8V power supply and a 3.3V power supply, and which is power-supply-de-coupled by a decoupling capacitor fabricated to withstand a maximum of only 1.8V across its terminals. In such circuits, it may need to be ensured that the use of capacitors designed for lower voltages can reliably support circuit operation at higher voltages, i.e., without damage to the capacitors.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit (IC) includes a functional circuit and a capacitor cell. The functional circuit is coupled between a power supply terminal and a ground terminal of the IC. The functional circuit receives a power supply for operation on the power supply terminal. The power supply is provided with a first voltage value for a first logic-level swing of an output of the functional circuit, and with a second voltage value for a second logic-level swing of the output of the functional circuit. The first voltage value is greater than the second voltage value, and the first logic-level swing is greater than the second logic-level swing. The capacitor cell is coupled between the power supply terminal and the ground terminal, and includes a first capacitor, a second capacitor, and multiple switches. When the output is to be provided with the first logic-level swing, the switches are operable to couple the first capacitor and the second capacitor in a series arrangement between the power supply terminal and the ground terminal. When the output is to be provided with the second logic-level swing, the switches are operable to couple the first capacitor and the second capacitor in a parallel arrangement between the power supply terminal and the ground terminal.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

FIG. 2 is a circuit of a capacitor cell in an embodiment.

FIG. 3A is an equivalent circuit of a capacitor cell in a mode of operation, in which a higher of two power supply voltages is used for operation of I/O circuits of an IC.

FIG. 3B is an equivalent circuit of a capacitor cell in a mode of operation, in which a lower of two power supply voltages is used for operation of I/O circuits of an IC.

The drawing in which an element first appears is indicated by the leftmost digit(s) in the corresponding reference number.

DETAILED DESCRIPTION

Figure 1:
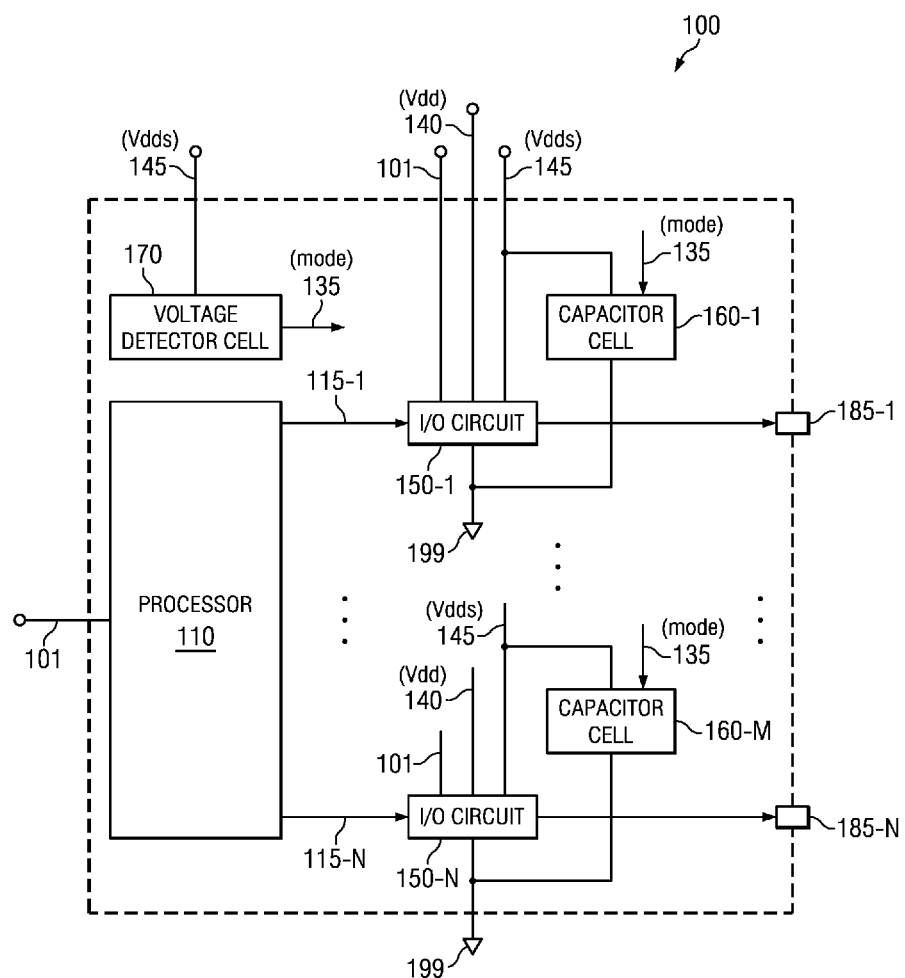
FIG. 1 is a block diagram illustrating the details of an example component in which several embodiments can be implemented.

Various embodiments are described below with examples for illustration.

1. Example Component

FIG. 1 is a block diagram illustrating an example component in which several embodiments of the present disclosure can be implemented. Integrated circuit (IC) 100 is shown containing processor 110, input-output (I/O) circuits 150-1 through 150-N, capacitor cells 160-1 through 160-M, and voltage detector cell 170. Terminals 101, 140 and 145 represent power supply terminals. In an embodiment, supply voltages on terminals 101 and 140 respectively equal 1.0V and 1.8V. In the embodiment, based on whether I/O circuits 150-1 through 150-N are to generate output signals (185-1 through 185-N) with a logic-level swing of 0V-1.8V or 0V-3.3V, the supply voltage received on terminal 145 equals 1.8V or 3.3V. Logic-level swing refers to the voltage difference between the logic-high and logic-low levels of the output signals. Terminal 199 is a ground terminal. Terminals 185-1 and 185-N represent pads (or package pins) of IC 100.

While the specific values of power supply voltages on terminal 145 are noted as 1.8V and 3.3V, the values can be different in other embodiments. Similarly, the values of power supply voltages on terminals 140 and 101 can be different in other embodiments. The details of FIG. 1 are meant to be merely illustrative, and IC 100 may contain more blocks/components and/or different arrangement of the blocks/components.

Processor 110 receives a power supply on path 101. Processor 110 generates binary data on each of paths path 115-1 through 115-N. The logic-level swing of data on each of paths 115-1 through 115-N is determined by the value of power supply voltage 101, and equals 0V-1.0V in an embodiment.

I/O circuit 150-1 receives binary data on path 115-1, and generates a corresponding buffered data on path/pad 185-1. The output impedance of I/O circuit 150-1 may be designed to have a controlled value to match the characteristic impedance of the transmission path connected to pad 185-1 to minimize signal reflections. Each of I/O circuits 150-2 (not shown) through 150-N operates in a manner similar to I/O circuit 150-1 to generate corresponding buffered outputs based on the data received as inputs. Thus, I/O circuit 150-N receives binary data on path 115-N, and generates a corresponding buffered data on path/pad 185-N.

Based on whether I/O circuits 150-1 through 150-N are required to generate output signals with a logic-level swing of 0V-1.8V or 0V-3.3V, the supply voltage received on terminal 145 respectively equals 1.8V or 3.3V. In general, I/O circuits 150-1 through 150-N are designed to generate output signals with one of two logic-level swings, with one logic-level swing being greater than the other. Voltage detector cell 170 receives the voltage at power supply terminal 145, and generates mode signal 135 (mode) specifying whether the voltage on power supply terminal 145 is 1.8V or 3.3V. Mode signal 135 may be a binary signal, with one logic level specifying that the voltage on path 145 equals 1.8V and the other logic level specifying that the voltage on path 145 equals 3.3V. I/O circuits 150-1 through 150-N, and voltage detector cell 170 may be implemented in a known way. Typically, power supply 145 is used to power the output stages of each of I/O circuits 150-1 through 150-N. An output stage of an I/O circuit generally refers to the portion of the I/O circuit that generates an output signal (such as the signal provided on pad 185-1). Power supplies 140 and 101 are used to power level-shifter stages and other control blocks contained in each of I/O circuits 150-1 through 150-N.

Each of capacitor cells 160-1 through 160-M contains one or more capacitors, and is designed to provide decoupling capacitance between the power supply (145) and ground (199) terminals of each of respective I/O circuits 150-1 through 150-N. Although in FIG. 1, each I/O circuit is shown as being decoupled by a different (unique) capacitor cell, it is noted here that the number (M) of capacitor cells in IC 100 may be different from the number (N) of I/O circuits that need to be provided decoupling capacitance. Typically, M is smaller than N, and a single capacitor cell may be used to decouple more than one I/O circuit. The specific ratio M:N may be selected based on the signal-to-power (s2p) ratio for IC 100, as noted below.

As is well-known in the relevant arts, the maximum voltage that a capacitor can withstand across its terminals is usually limited. A voltage greater than such maximum voltage may damage the capacitor. When implemented within an IC, capacitors are usually implemented using a MOS (metal oxide semiconductor) transistor structure, referred to henceforth as a MOS capacitor. The characteristics (including thickness) of the gate oxide of such MOS transistor structure typically determine a maximum voltage that such capacitors can withstand across their terminals (inter-terminal voltage) without damage.

Thus, for example, a MOS capacitor fabricated using a 1.8V gate-oxide process is typically able to withstand an inter-terminal voltage of a maximum of 1.8V. Similarly, a MOS capacitor fabricated using a 3.3V gate-oxide process is typically able to withstand an inter-terminal voltage of a maximum of 3.3V. Further, the capacitance of a MOS capacitor is generally a function of the voltage applied across its terminals.

The value of decoupling capacitance provided for a circuit (such as any of I/O circuits 150-1 through 150-N) may have a bearing on the signal integrity (or signal quality) of the output signal of the circuit, as well as the area required to implement the decoupling capacitor. Generally, larger the decoupling capacitance, better is the signal quality of the output signal, and larger the implementation area required for the capacitor.

In an IC (such as IC 100), decoupling capacitors are typically implemented as part of power cells and ground cells of the IC, and placed at desired (typically equal) intervals in an I/O ring formed by I/O cells (such as I/O circuits 150-1 through 150-N) of the IC. The ratio of the number of power cells (and ground cells) to the number of I/O cells may be specified by a desired signal-to-power (s2p) ratio, determined in the IC design stage. Thus, for example, an s2p ratio of 6:1:1 specifies that one power supply cell and one ground cell needs to be implemented for every six I/O cells (or I/O circuits). However, if decoupling capacitance values realizable (or implementable) are not sufficiently high, the s2p ratio may need to be tightened, for example, to 4:1:1, i.e., one power supply cell and one ground cell for every four I/O cells. Such tightened s2p requirement (due to relatively lower decoupling capacitance values realizable) typically translates to a need to implement a greater number of power and ground cells for a same total number of I/O cells, thereby potentially resulting in larger implementation area (i.e., larger die size).

A measure of "efficiency" of a decoupling capacitor is the ratio of the value of capacitance (and therefore the impedance that the decoupling capacitor offers to noise in a target frequency range, a lower impedance translating to better efficiency) that is realizable to the area required for implementing the decoupling capacitor. The target frequency range with respect to decoupling capacitors may, in general, depend on several factors such as the current (and variations in the current) drawn by a load from the output of an I/O circuit, package and board parasitics, power plane noise, ground plane noise, etc. In an embodiment, the target noise frequency range is 50 MHz to 150 MHz.

It may be desirable to implement a decoupling capacitance scheme to support circuit operation at higher-voltages while employing capacitors designed for lower voltages. Further, it may be desirable to implement a decoupling capacitance scheme to maximize the capacitance obtainable without incurring an increased area penalty.

2. Capacitor Cell

FIG. 2 is a circuit diagram of a capacitor cell designed to provide decoupling capacitance, in an embodiment. Capacitor cell 160-1 of FIG. 1 is shown containing capacitors 210 and 220, and transistors 230, 240, 250, 260, 270 and 280. Bulk terminals of capacitors 230, 240, 260 and 270 are connected to a voltage 201. Node 201 receives a voltage equal to VDDS during normal operation, but during power-up of IC 100 may receive a different bias voltage to bias the bulk terminals appropriately to prevent latch-up. Capacitors 210 and 220 are MOS capacitors, and are used to provide decoupling capacitance in each of a 3.3V mode (when power supply 145 equals 3.3V) and 1.8V mode (when power supply 145 equals 1.8V) of operation of I/O circuit 150-1. Each of capacitors 210 and 220 is fabricated using a 1.8V gate oxide process. Hence, the maximum safe voltage that can be applied across each of the capacitors equals 1.8V.

It is assumed in the description below that the ON resistance of the transistors 240, 250 and 260 of FIG. 2 is zero or negligible. However the ON resistance of transistor 230 is designed to have a large value. In an embodiment, power supply 140 (1.8V) is provided to each of capacitor cells 160-1 and 160-M since power supply 140 is required for operation of I/O circuits 150-1 through 150-N, and thus readily available. In embodiments in which power supply 140 is not required for operation of the corresponding circuits for which decoupling capacitance is to be provided, a voltage reference providing the same voltage as power supply 140 may be used. Such a voltage reference may either be implemented within the corresponding capacitor cell, outside the capacitor cell but within IC 100, or be implemented external to IC 100.

Capacitor cells 160-2 through 160-M (of FIG. 1) are implemented similar to capacitor cell 160-1. The operation of capacitor cell 160-1 is described next.

Operation in 3.3 V Mode

In the 3.3V mode, power supply at terminal 145 (Vdds) equals 3.3V, and power supply at terminal 140 (Vdd) equals 1.8V. Mode signal 135 generated by voltage detector cell 170 is a logic zero. As a result, transistors 230 and 240 are ON, and transistors 250 and 280 are OFF. Since transistor 240 is ON, nodes 212 and 224 electrically represent a same point in the circuit. Transistor 270 is ON since gate-source voltage of transistor 270 is greater than the threshold voltage Vt. Therefore, a voltage of 3.3V (from terminal 145) is passed to node 278, thereby causing transistor 260 to be OFF.

Due to the conditions noted above, the circuit of FIG. 2 reduces to the circuit shown in FIG. 3A. Thus, in the 3.3V mode, capacitors 210 and 220 are connected in series between power supply terminal 145 and ground 199. The effective decoupling capacitance provided in the 3.3V mode equals (C1*C2)/(C1+C2), wherein C1 and C2 respectively represent the capacitances of capacitors 210 and 220. Assuming each of C1 and C2 equals C, the effective decoupling capacitance provided across terminals 145 and 199 equals C/2.

Junction node 224 (or equivalently 212) is DC-biased to power supply 140 (through a weak transistor 230), and the voltage at node 224 equals 1.8V. Thus, a DC bias of 1.5V (3.3V−1.8V) is provided across capacitor 210, and a DC bias of 1.8V (1.8V−0V) is provided across capacitor 220. As noted above, the capacitance of a MOS capacitor is generally a function of the voltage applied across its terminals. Typically, higher the voltage (within a maximum limit) higher is the capacitance value of the MOS capacitor. The DC bias voltages across capacitors 210 and 220 ensure that the capacitance value thus obtained from each of capacitors 210 and 220 is sufficiently large. Path 301 in FIG. 3A represents the ON-impedance of transistor 230, and is designed to have a large value.

It may be observed from FIG. 3A that the inter-terminal voltages across capacitors 210 and 220 are less than 1.8V. Hence, neither of the capacitors 210 and 220 is subjected to inter-terminal voltage stresses beyond the safe limit of 1.8V.

Operation in 1.8 V Mode

In the 1.8V mode, power supply at terminal 145 (Vdds) equals 1.8V, and power supply at terminal 140 (Vdd) equals 1.8V. Mode signal 135 generated by voltage detector cell 170 is a logic one. As a result, transistors 250 and 280 are ON, and transistors 230 and 240 are OFF. Transistor 270 is OFF since gate-source voltage of transistor 270 equals 0V. Transistor 260 is ON since source and gate terminals of transistor 260 are at 1.8V and 0V respectively.

Due to the conditions noted above, the circuit of FIG. 2 reduces to the circuit shown in FIG. 3B. Thus, in the 1.8V mode, capacitors 210 and 220 are connected in parallel between power supply terminal 145 and ground 199. The effective decoupling capacitance provided across terminals 145 and 199 in the 1.8V mode equals (C1+C2). Assuming C1 and C2 equal C, the effective decoupling capacitance equals 2C. A bias of 1.8V is provided across each of capacitors 210 and 220. Further, the inter-terminals voltage across each of capacitors 210 and 220 is equal to 1.8V, and neither of capacitors 210 and 220 is stressed beyond the safe limit of 1.8V.

It may be appreciated that the scheme described above enables capacitors designed to withstand lower maximum inter-terminal voltages to be used to implement a decoupling capacitance cell that can be used in circuits powered by a power supply voltage greater than the maximum inter-terminal voltage. Further, the techniques described above enable sufficiently large decoupling capacitance values to be obtained in each of the two modes, i.e., 3.3V mode and 1.8V mode, without subjecting the capacitors to voltage stresses beyond a safe limit.

Capacitor cells implemented as described above can be used, in general, to provide decoupling capacitance for any circuit (functional circuit) that operates to provide a desired function, and which may need to be operated (in corresponding operating modes) from one of two possible power supply voltages, one power supply voltage being greater than the other. Such functional circuits may additionally need to receive a reference voltage equal in value to the lower of the two power supply voltages noted above. While noted above as being used for providing decoupling capacitance for circuits, capacitor cells 160-1 through 160-M (and the capacitance scheme of FIG. 2 in general) can be used in non-decoupling capacitor contexts as well. Further, while the description herein is provided with respect to integrated circuit (e.g., MOS) capacitors, the capacitor cells described herein may be implemented using other technologies as well (for example, convention parallel plate capacitors).

In the illustrations of FIGS. 1 and 2, though terminals/nodes are shown with direct connections to various other terminals, it should be appreciated that additional components (as suited for the specific environment) may also be present in the path, and accordingly the connections may be viewed as being electrically coupled to the same connected terminals.

The circuit topology of FIG. 2 is merely representative. Various modifications, as suited for the specific environment, without departing from the scope and spirit of several aspects of the present disclosure, will be apparent to one skilled in the relevant arts by reading the disclosure provided herein. It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the PMOS transistors may be replaced with NMOS transistors, while also interchanging the connections to power and ground terminals. Accordingly, in the instant application, power and ground terminals are referred to as constant reference potentials, the source (emitter) and drain (collector) terminals of transistors (through which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An integrated circuit (IC) comprising:
a functional circuit coupled between a power supply terminal and a ground terminal of the IC, the functional circuit to receive a power supply for operation on the power supply terminal, wherein the power supply is provided with a first voltage value for a first logic-level swing of an output signal of the functional circuit, wherein the power supply is provided with a second voltage value for a second logic-level swing of the output signal of the functional circuit, wherein the first voltage value is greater than the second voltage value, and wherein the first logic-level swing is greater than the second logic-level swing; and a capacitor cell coupled between the power supply terminal and the ground terminal, the capacitor cell comprising:
a first capacitor and a second capacitor; and
a plurality of switches operable to couple the first capacitor and the second capacitor in a series arrangement between the power supply terminal and the ground terminal when the output signal is to be provided with the first logic-level swing,
the plurality of switches operable to couple the first capacitor and the second capacitor in a parallel arrangement between the power supply terminal and the ground terminal when the output signal is to be provided with the second logic-level swing.

2. The IC of claim 1, wherein each of the first capacitor and the second capacitor is fabricated as a metal oxide semiconductor (MOS) capacitor according to a first fabrication process, wherein each of the first capacitor and the second capacitor is designed to withstand a maximum inter-terminal voltage determined by the first fabrication process, wherein the first voltage value exceeds the maximum inter-terminal voltage.

3. The IC of claim 2, further comprising a voltage detector cell to receive the power supply, and to generate a mode signal specifying whether the power supply has the first voltage value or the second voltage value,
wherein the mode signal controls the operation of at least some of the switches in the plurality of switches.

4. The IC of claim 2, wherein the capacitor cell receives a reference voltage,
wherein, when the output signal is to be provided with the first logic-level swing, the reference voltage is coupled to a junction of the first capacitor and the second capacitor.

5. The IC of claim 1, wherein the functional circuit is an input/output (I/O) cell, the IC further comprising a processor to generate binary data,
wherein the I/O cell receives the binary data and generates the output signal to represent the binary data with a logic-level swing equaling one of the first logic-level swing and the second logic-level swing.

6. A capacitor cell coupled between a first constant reference potential and a second constant reference potential, the capacitor cell comprising:
a first capacitor and a second capacitor; and
a plurality of switches operable to couple the first capacitor and the second capacitor either in a series arrangement between the first reference potential and the second reference potential or a parallel arrangement between the first reference potential and the second reference potential;
wherein the capacitor cell is coupled to provided decoupling capacitance to a functional circuit, wherein the functional circuit is also coupled between the first constant reference potential and the second constant reference potential, the functional circuit to receive the first constant reference potential for operation, wherein the first constant reference potential has a first voltage value for a first logic-level swing of an output signal of the functional circuit, wherein the first constant reference potential has a second voltage value for a second logic-level swing of the output signal of the functional circuit, wherein the first voltage value is greater than the second voltage value, wherein the first logic-level swing is greater than the second logic-level swing,
wherein the plurality of switches are operable to couple the first capacitor and the second capacitor in the series arrangement when the output signal is to be provided with the first logic-level swing, and
wherein the plurality of switches are operable to couple the first capacitor and the second capacitor in the parallel arrangement when the output signal is to be provided with the second logic-level swing.

7. The capacitor cell of claim 6, wherein each of the first capacitor and the second capacitor is fabricated as a metal oxide semiconductor (MOS) capacitor according to a first fabrication process, wherein each of the first capacitor and the second capacitor is designed to withstand a maximum inter-terminal voltage determined by the first fabrication process, wherein the first voltage value exceeds the maximum inter-terminal voltage.

8. The capacitor cell of claim 6, wherein a mode signal controls the operation of at least some of the switches in the plurality of switches, the mode signal being generated by a voltage detector cell, the mode signal specifying whether the first constant reference potential has the first voltage value or the second voltage value.

9. The capacitor cell of claim 6, wherein, when the output signal is to be provided with the first logic-level swing, a reference voltage is coupled to a junction of the first capacitor and the second capacitor.

* * * * *